United States Patent
Lum et al.

(10) Patent No.: US 8,395,960 B2
(45) Date of Patent: Mar. 12, 2013

(54) MEMORY CIRCUITS HAVING A PLURALITY OF KEEPERS

(75) Inventors: Annie Lum, San Jose, CA (US); Derek Tao, Fremont, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 363 days.

(21) Appl. No.: 12/778,714

(22) Filed: May 12, 2010

(65) Prior Publication Data

US 2011/0280095 A1    Nov. 17, 2011

(51) Int. Cl.
*G11C 8/00*    (2006.01)

(52) U.S. Cl. .............. 365/230.05; 365/189.08; 365/196; 365/230.03

(58) Field of Classification Search ............. 365/189.08, 365/196, 230.03, 230.05
See application file for complete search history.

(56) References Cited

U.S. PATENT DOCUMENTS

| | | | | |
|---|---|---|---|---|
| 5,777,928 A | * | 7/1998 | Vidwans et al. | 365/189.05 |
| 5,828,610 A | * | 10/1998 | Rogers et al. | 365/203 |
| 2004/0139271 A1 | * | 7/2004 | Khellah et al. | 711/1 |
| 2008/0259712 A1 | * | 10/2008 | Lambrache et al. | 365/230.05 |
| 2009/0086529 A1 | * | 4/2009 | Asayama | 365/156 |

* cited by examiner

*Primary Examiner* — Hoai V Ho

(74) *Attorney, Agent, or Firm* — Lowe Hauptman Ham & Berner, LLP

(57) ABSTRACT

A memory circuit includes a first plurality of memory arrays disposed in a column fashion. The memory circuit includes a first plurality of keepers each of which is electrically coupled with a corresponding one of the first plurality of memory arrays. A first current limiter is electrically coupled with and shared by the first plurality of keepers.

20 Claims, 8 Drawing Sheets

MEMORY CIRCUITS HAVING A PLURALITY OF KEEPERS

TECHNICAL FIELD

The present disclosure relates generally to the field of semiconductor circuits, and more particularly, to memory circuits having a plurality of keepers.

BACKGROUND

Memory circuits have been used in various applications. Conventionally, memory circuits can include dynamic random access memory (DRAM) circuits, static random access memory (SRAM) circuits, and non-volatile memory circuits. An SRAM circuit includes a plurality of memory cells. For a conventional 6-T SRAM circuit in which arrays of memory cells are provided, each of the memory cells has six transistors. The 6-T SRAM memory cell is coupled with a bit line BL, a bit line bar BLB, and a word line WL. Four of the six transistors form two cross-coupled inverters for storing a datum representing "0" or "1". The remaining two transistors serve as access transistors to control the access of the datum stored within the memory cell.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
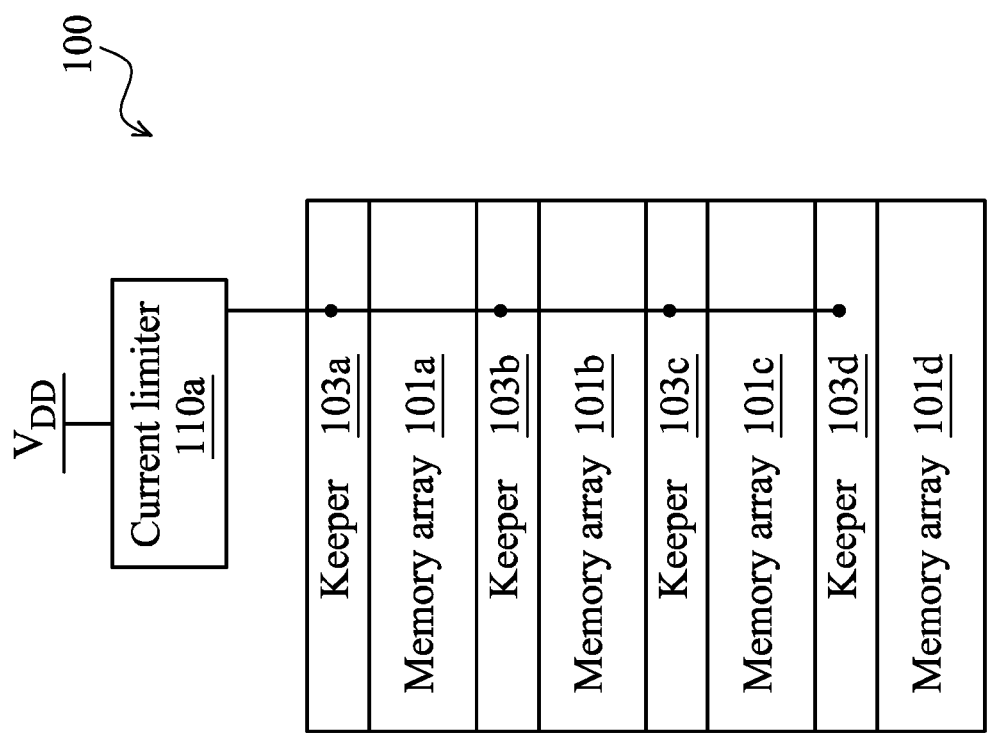
FIG. 1 is a schematic drawing illustrating an exemplary memory circuit including a current limiter coupled with a plurality of keepers.

Conventionally, a SRAM circuit has a plurality of memory arrays and a plurality of keepers. The memory arrays and the keepers are in turn disposed in a single column of the SRAM circuit. Each keeper has a long-channel transistor electrically coupled with an inverter. The long-channel transistor has a channel length that is substantially larger than a channel length of a core transistor. Since each keeper has the long-channel transistor, a large area of the SRAM circuit is used to accommodate the long-channel transistors of the keepers.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic drawing illustrating an exemplary memory circuit including a current limiter coupled with a plurality of keepers. In FIG. 1, a memory circuit 100 can include a plurality of memory arrays, e.g., memory arrays 101a-101d and a plurality of keepers, e.g., keepers 103a-103d. In some embodiments, the integrated circuit 100 can be a static random access memory (SRAM) circuit, e.g., a single-port sensing SRAM circuit or a multi-port SRAM circuit, an embedded SRAM circuit, e.g., a single-port sensing embedded SRAM circuit or a multi-port embedded SRAM circuit, or another type of memory circuit. It is noted that the number of the memory arrays and keepers shown in FIG. 1 is merely exemplary. In some embodiments, more memory arrays and/or keepers can be added.

In some embodiments, the keepers 103a-103d can each be electrically coupled with the corresponding memory arrays 101a-101d, respectively. The memory circuit 100 can include at least one current limiter, e.g., a current limiter 110a. The current limiter 110a can be electrically coupled with and shared by the keepers 103a-103d. In some embodiments, the current limiter 110a can be electrically coupled between a power supply line for providing a power voltage, e.g., $V_{DD}$, and another power supply line for providing a power voltage, e.g., $V_{SS}$ or ground (not shown).

In some embodiments, the current limiter 110a can be configured to control and/or limit a current flowing through the current limiter 110a during a sensing period for sensing a datum stored in a memory cell (not shown) of one of the memory arrays 101a-101d. During the sensing period, if a read port of the memory cell is turned on and a voltage drop is across the read port, another current can flow through the read port of the memory cell to fight the current of the current limiter 110a. Due to the current fight, the datum stored in the memory cell can be sensed and/or outputted for further sensing. It is found that the current limiter 110a can be shared by the keepers 103a-103d for operations of sensing data stored in the memory arrays 101a-101d, respectively. Since the keepers 103a-103d have small-channel transistors, the area of the keepers 103a-103d is reduced. The area of the integrated circuit 100 to accommodate the keepers 103a-103d can be reduced, too.

Figure 2:
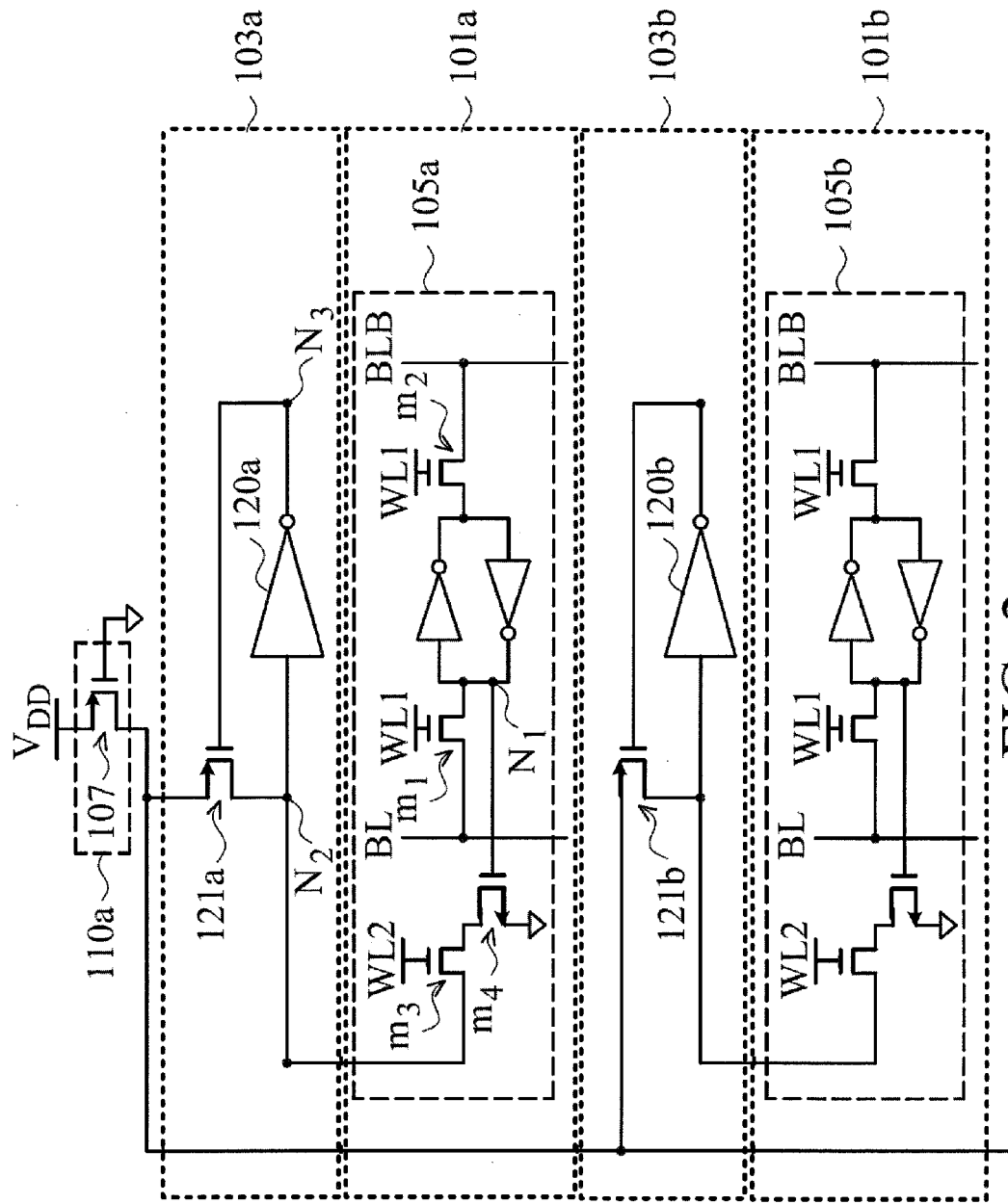
FIG. 2 is a schematic drawing illustrating another exemplary memory circuit including a current limiter coupled with a plurality of first exemplary keepers.

FIG. 2 is a schematic drawing illustrating an exemplary memory circuit including a current limiter coupled with a plurality of first exemplary keepers. In FIG. 2, the memory arrays 101a-101b can each include at least one memory cell, e.g., memory cells 105a-105b, respectively. For embodiments using an 8-T SRAM memory cell, the memory arrays 101a-101b can each include a plurality of word lines WL1s and WL2s and a plurality of bit lines BLs and BLBs. The memory cells 105a-105b can each be electrically coupled with a bit line BL, a bit line bar BLB, word lines WL1 and WL2, a first power source line for providing a power voltage, e.g., VDD, and a second power source line for providing a power voltage, e.g., VSS or ground. It is noted that though only one memory cell 105a is depicted in the memory array 101a, other memory cells (not shown) can be coupled with the plurality of word lines WL1s and WL2s and bit lines BLs, BLBs of the memory array 101a. In some embodiments, the memory arrays 101a-101b can each have 8, 16, 32, 64, 128 or more columns that can be arranged in word widths. In other embodiments, the word lines WL1s and/or WL2s can be laid out substantially orthogonally to the bit lines BLs and BLBs. In still other embodiments, other arrangements of the word lines WL1s and WL2s and bit lines BLs and BLBs can be provided.

Referring to FIG. 2, the memory cell 105a can include two cross-latch inverters (not labeled) forming a flip-flop for storing the datum of the memory cell 105a. Gates of transistors $m_1$ and $m_2$ can be electrically coupled with the word line WL1. The transistors $m_1$ and $m_2$ can be operative as two pass transistors, access transistors, or pass gates. The memory cell 105a can also include a read port (not labeled). In some embodiments, the read port can include transistors $m_3$ and $m_4$. A gate of the transistor $m_3$ can be electrically coupled with the word line WL2. A source/drain (S/D) end of the transistor $m_3$ can be electrically coupled with the keeper 103a. A gate of the transistor $m_4$ can be electrically coupled with a node $N_1$ of the cross-latch inverters. The transistors $m_3$ and $m_4$ can be operative as pass transistors, access transistors, or pass gates. In the embodiment shown in FIG. 2, the transistors $m_3$ and $m_4$ are N-type metal-oxide semiconductor (NMOS) transistors.

Referring to FIG. 2, the keepers 103a-103b can each include at least one transistor, e.g., transistors 121a-121b, electrically coupled with a logic gate, e.g., NOT gates 120a-120b, respectively. In some embodiments, the NOT gates 120a-120b can each be referred to as an inverter. In this embodiment, the transistors 121a-121b can each be a P-type metal-oxide semiconductor (PMOS) transistor. In some embodiments, an input end $N_2$ of the NOT gate 120a can be electrically coupled with a drain end of the transistor 121a and the S/D end of the transistor $m_3$. An output end $N_3$ of the NOT gate 120a can be electrically coupled with a gate of the transistor 121a. In some embodiments, the transistors 121a and 121b can each be a core transistor. The term "core transistor" can represent that the transistor is formed by the process node for forming the memory circuit 100. For example, if the process node is a 40-nm (nanometer) technology, the core transistor can have a channel length of about 40 nm. It is noted the process node is merely exemplary. In other embodiments, the process node can be larger or smaller than the 40-nm technology. In still other embodiments, a channel length of the transistor 121a can be substantially equal to a channel length of a transistor (not shown) of the cross-latch inverters of the memory cell 105a.

Referring again to FIG. 2, the current limiter 110a can include at least one transistor, e.g., a transistor 107. In some embodiments, the transistor 107 can be a PMOS transistor. A source end of the transistor 107 can be electrically coupled with a power source line for providing a power voltage, e.g., $V_{DD}$. A drain end of the transistor 107 can be electrically coupled with the keepers 103a and 103b. A gate of the transistor 107 can be electrically coupled with a power source line for providing a power voltage, e.g., $V_{SS}$ or ground. The power voltage $V_{SS}$ or ground can turn on the transistor 107 during a precharge period and/or a sensing period. In some embodiments, the transistor 107 has a channel length that is larger the channel length of the transistor 121a. In other embodiments, the transistor 107 can be referred to as a long-channel transistor.

As noted, the keeper 103a can include a transistor 121a, e.g., a core transistor, which has a smaller channel than the channel of the transistor 107 and is operative as a pass gate. The area of the keeper 103a can be smaller than the conventional keeper that uses a long-channel device. It is also noted that the current limiter 110a can be shared by the keepers 103a-103b. The total area of the memory circuit 100 can be smaller than the SRAM circuit using the conventional keepers.

Following are descriptions regarding an exemplary method for precharging the input end $N_2$ of the NOT gate 120a. During a precharge period, at least one precharge transistor (not shown) that is coupled with the input end $N_2$ of the NOT gate 120a can be turned on. The turned-on precharge transistor can electrically couple the input end $N_2$ of the NOT gate 120a to a power source line so as to precharge the input end $N_2$ of the NOT gate 120a toward a power voltage, e.g., $V_{DD}$. During the precharge period, the transistor $m_3$ is turned off. The turned-off transistor $m_3$ can electrically isolate the memory cell 105a from the keeper 103a.

As noted, the input end $N_2$ of the NOT gate 120a can be precharged toward the power voltage $V_{DD}$. Once the voltage on the input end $N_2$ of the NOT gate 120a is raised to a predetermined voltage level or the power voltage $V_{DD}$, the NOT gate 120a can invert the voltage state, e.g., a high voltage state, on the input end $N_2$ of the NOT gate 120a to another voltage state, e.g., a low voltage state, on the output $N_3$ of the NOT gate 120a. The low voltage state, e.g., having a power voltage $V_{SS}$ or ground, can turn on the transistor 121a.

As noted, the transistor 107 is turned on during the precharge period. The turned-on transistor 107 can electrically couple the power voltage $V_{DD}$ to the source end of the transistor 121a. The turned-on transistor 121a can electrically couple the power voltage $V_{DD}$ on the source end of the transistor 121a to the input end $N_2$ of the NOT gate 120a. The voltage level on the input end $N_2$ of the NOT gate 120a can thus be kept at the power voltage $V_{DD}$. The precharge operation described above in conjunction with the memory cell 105a can be also applied to the memory cell 105b.

Following are descriptions regarding an exemplary method for sensing the datum stored in the memory cell 105a. In some embodiments, the precharge transistor (not shown) can be turned off before the sensing period. Since the datum stored in the memory cell 105a is to be accessed, the word line WL1 and/or WL2 of the memory cell 105b are not charged.

During the sensing period, the word line WL2 of the memory cell 105a can be charged to turn on the transistor $m_3$. In some embodiments, the node $N_1$ of the cross-latch inverters can store a logic state, e.g., logic 1, or have a voltage state, e.g., a high voltage state. The voltage state on the node $N_1$ can turn on the transistor $m_4$. The turned-on transistors $m_3$ and $m_4$ can electrically coupled the input end $N_2$ of the NOT gate 120a to a power voltage, e.g., $V_{SS}$ or ground. In some embodiments, the turn on of the transistors $m_3$ and $m_4$ can be referred to as the turn on of the read port of the memory cell 105a. As noted, after the precharge period, the voltage level on the input end $N_2$ of the NOT gate 120a can be initially kept at the power voltage $V_{DD}$. Due to the voltage drop across the transistors $m_3$ and $m_4$, a current can flow through the transistors $m_3$ and $m_4$ during the sensing period.

As noted, the current limiter 110a is configured to control and/or limit a current flowing through the current limiter 110a. For example, during the sensing period the transistor 107 is turned on. A current can flow through the transistor 107 during the sensing period. It is found that during the sensing period the current flowing through the transistors $m_3$ and $m_4$ can be larger than the current flowing through the transistor 107. Due to the current fight, the voltage level on the input end $N_2$ of the NOT gate 120a can be pulled down toward the power voltage $V_{SS}$ or ground. Once the voltage on the input end $N_2$ of the NOT gate 120a is lower than a predetermined voltage level or reaches the power voltage $V_{SS}$, the NOT gate 120a can invert the voltage state, e.g., a low voltage state, on input end $N_2$ of the NOT gate 120a to another voltage state, e.g., a high voltage state, on the output $N_3$ of the NOT gate 120a. The high voltage state, e.g., having a power voltage $V_{DD}$, can turn off the transistor 121a. The turned-off transistor 121a can electrically isolate the power voltage $V_{DD}$ on the drain end of the transistor 107 from the input end $N_2$ of the NOT gate 120a. The voltage state on the input end $N_2$ of the NOT gate 120a can thus be kept at the power voltage $V_{SS}$. The datum stored in the memory cell 105a can thus be sensed and/or outputted for further sensing.

Figure 3:
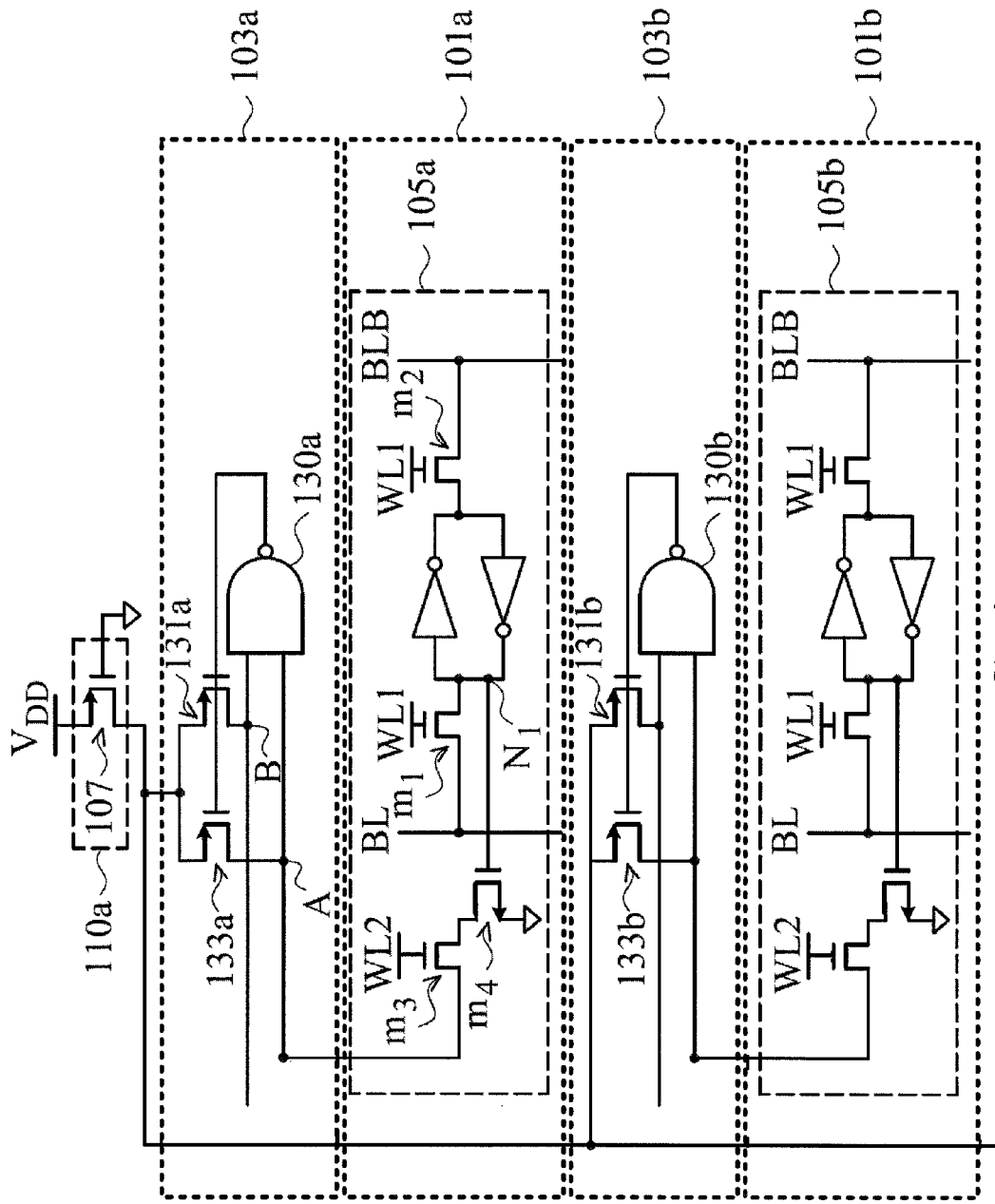
FIG. 3 is a schematic drawing illustrating another exemplary memory circuit including a current limiter coupled with a plurality of second exemplary keepers.

FIG. 3 is a schematic drawing illustrating another exemplary memory circuit including a current limiter coupled with a plurality of second exemplary keepers. In FIG. 3, the keepers 103a-103b can each include at least one transistor, e.g., transistors 131a, 133a, and 131b, 133b, electrically coupled with a logic gate, e.g., NAND gates 130a-130b, respectively. In some embodiments, the transistors 131a-131b and 133a-133b can each be a PMOS transistor. An input end A of the NAND gate 130a can be electrically coupled with a drain end of the transistor 133a and the S/D end of the transistor $m_3$. Another input end B of the NAND gate 130a can be electrically coupled with a drain end of the transistor 131a and another memory cell (not shown). An output end of the NAND gate 130a can be electrically coupled with gates of the transistors 131a and 133a. Source ends of the transistors 131a and 133a can be electrically coupled with the current limiter 110a. In some embodiments, the transistors 131a and 133a can each be a core transistor. In other embodiments, the transistor 107 has a channel length that is larger than each channel length of the transistors 131a and 133a.

The precharge and sensing operations for the memory cell 105a may be similar to those described above in conjunction with FIG. 2. Due to the use of a different logic gate, operations of the NAND gate 130a and the transistors 131a and 133a can be different. Additionally, the input ends A and B of the NAND gate 130a are electrically coupled with different memory cells.

Figure 4:
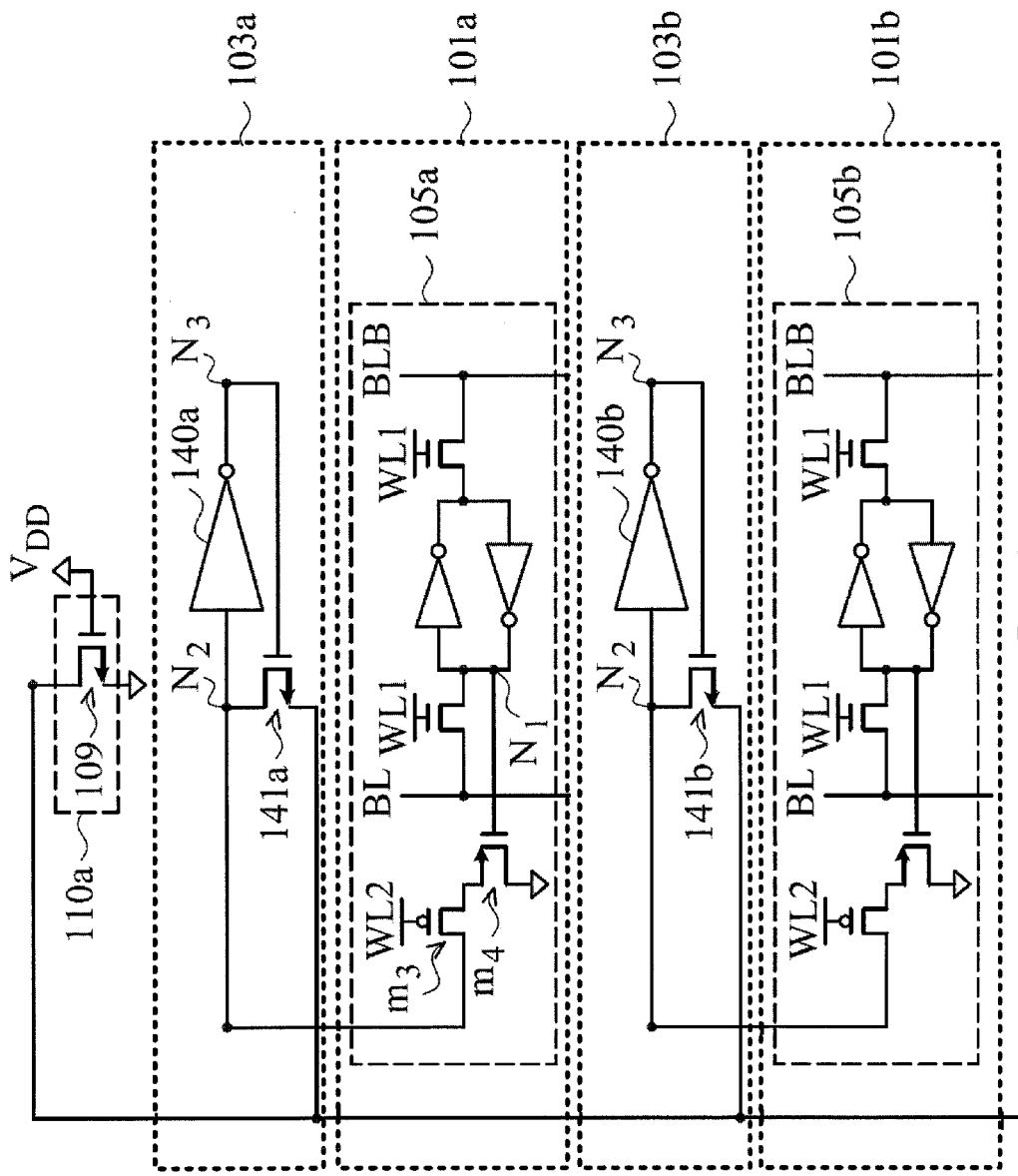
FIG. 4 is a schematic drawing illustrating an exemplary memory circuit including a current limiter coupled with a plurality of third exemplary keepers.

FIG. 4 is a schematic drawing illustrating an exemplary memory circuit including a current limiter coupled with a plurality of third exemplary keepers. In FIG. 4, the keepers 103a-103b can each include at least one transistor, e.g., transistors 141a-141b, electrically coupled with a logic gate, e.g., NOT gates 140a-140b, respectively. In some embodiments, the transistors 141a-141b can each be an N-type metal-oxide semiconductor (NMOS) transistor. For example, an input end $N_2$ of the NOT gate 140a can be electrically coupled with a drain end of the transistor 141a and the memory cell 105a. An output end $N_3$ of the NOT gate 140a can be electrically coupled with a gate of the transistor 141a. A source end of the transistor 141a can be electrically coupled with the current limiter 110a. In some embodiments, the transistors 141a and 141b can each be a core transistor.

Referring again to FIG. 4, the current limiter 110a can include at least one transistor, e.g., a transistor 109. In some embodiments, the transistor 109 can be a NMOS transistor. A source end of the transistor 109 can be electrically coupled with a power source line for providing a power voltage, e.g., $V_{SS}$ or ground. A drain end of the transistor 109 can be electrically coupled with the keepers 103a and 103b. A gate of the transistor 109 can be electrically coupled with a power source line for providing a power voltage, e.g., $V_{DD}$. In some embodiments, the transistor 109 can be referred to as a long-channel transistor and has a channel length that is larger than that of the transistor 141a. In the embodiment shown in FIG. 4, the transistors $m_3$ and $m_4$ are P-type metal-oxide semiconductor (PMOS) transistors.

The precharge and sensing operations for the memory cell 105a may be similar to those described above in conjunction with FIG. 2. Due to the use of different type of transistors, opposite voltage levels and/or voltage states may be applied during the precharge and/or sensing operations.

Figure 5:
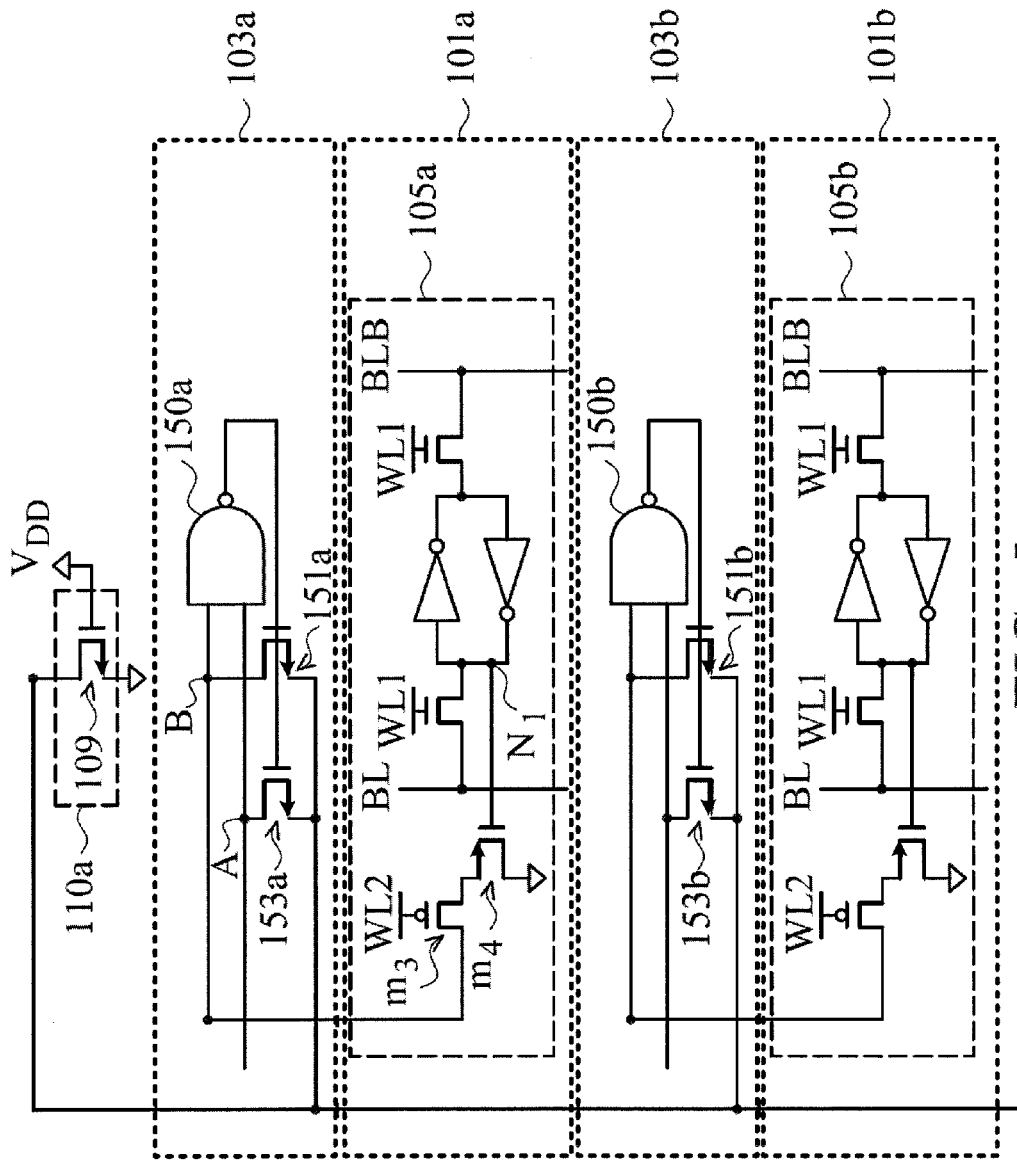
FIG. 5 is a schematic drawing illustrating an exemplary memory circuit including a current limiter coupled with a plurality of fourth exemplary keepers.

FIG. 5 is a schematic drawing illustrating an exemplary memory circuit including a current limiter coupled with a plurality of fourth keepers. In FIG. 5, the keepers 103a-103b can each include at least one transistor, e.g., transistors 151a, 153a, and 151b, 153b, electrically coupled with a logic gate, e.g., NAND gates 150a-150b, respectively. In some embodiments, the transistors 151a-151b and 153a-153b can each be an NMOS transistor. For example, an input end A of the NAND gate 150a can be electrically coupled with a drain end of the transistor 153a and the S/D end of the transistor $m_3$. Another input end B of the NAND gate 150a can be electrically coupled with a drain end of the transistor 151a and another memory cell (not shown). An output end of the NAND gate 150a can be electrically coupled with gates of the transistors 151a and 153a. Source ends of the transistors 151a and 153a can be electrically coupled with the current limiter 110a. In some embodiments, the transistors 151a and 153a can each be a core transistor. In other embodiments, the transistor 109 has a channel length that is larger each channel length of the transistors 151a and 153a.

It is noted that the number, type, and/or configurations of the transistors and logic gate of the keeper 103a described above in conjunction with FIGS. 2-5 are merely exemplary. In some embodiments, other logic gates, e.g., an AND gate, an OR gate, an NOR gate, another logic gate, or any combinations thereof, incorporating at least one transistors with various configurations may be used. The scope of the present application is not limited thereto.

Figure 6:
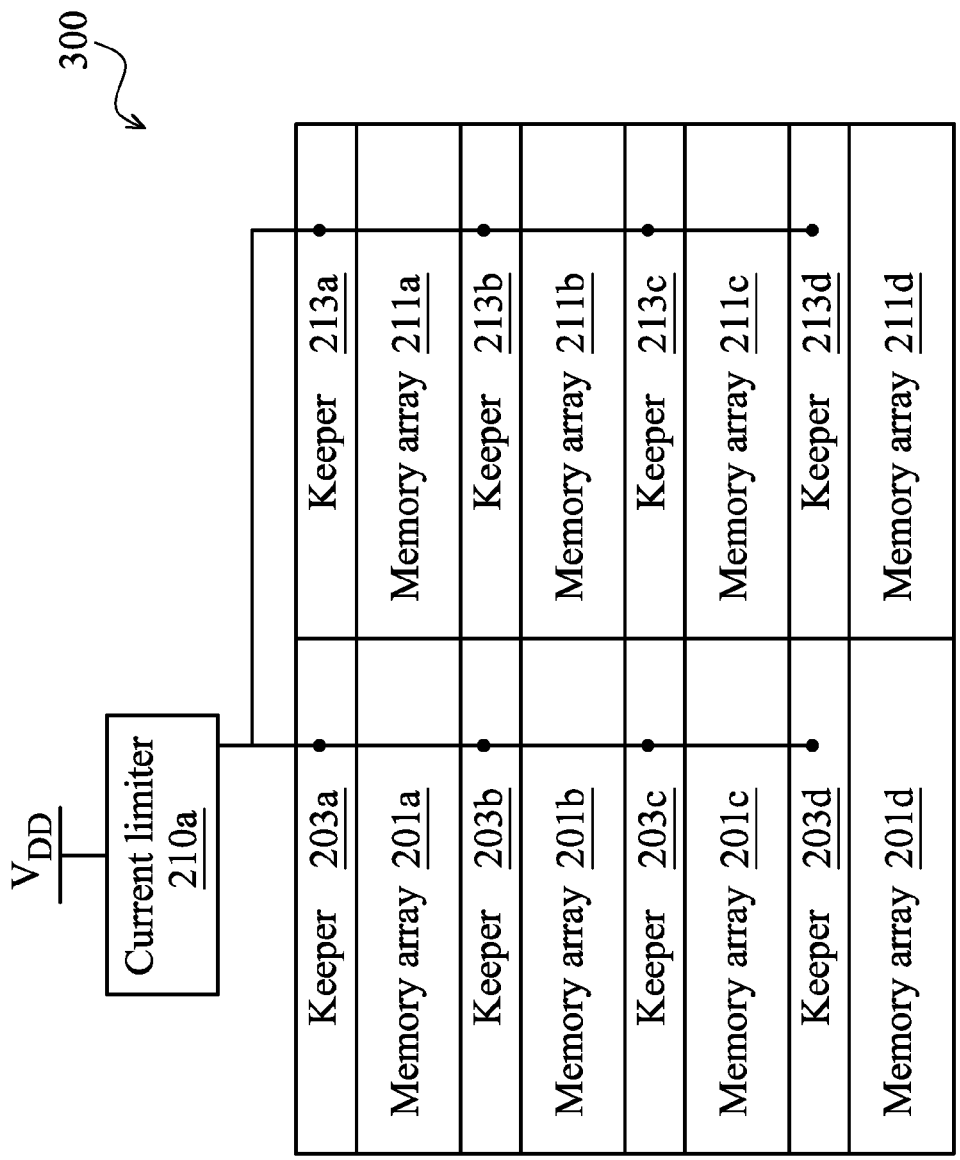
FIG. 6 is a schematic drawing showing another memory circuit having a current limiter shared by two columns of keepers.

FIG. 6 is a schematic drawing showing another memory circuit having a current limiter shared by two columns of keepers. Items of a memory circuit 200 in FIG. 6 that are the same or similar items of the integrated circuit 100 in FIG. 1 are indicated by the same reference numerals, increased by 100 or 110. In FIG. 6, the memory circuit 200 can include a plurality of memory arrays, e.g., memory arrays 201a-201d and 211a-211d, and a plurality of keepers, e.g., keepers 203a-203d and 213a-213d. The keepers 203a-203d and 213a-213d can each be electrically coupled with the corresponding memory arrays 201a-201d and 211a-211d, respectively. A current limiter 210a can be electrically coupled with and shared by the keepers 203a-203d and 213a-213d. Since the current limiter 210a can be shared by two columns of the keepers 203a-203d and 213a-213d, the area of the memory circuit 200 can be further reduced. In other embodiments, the current limiter 210a can be electrically coupled with and shared by three or more columns of keepers.

Figure 7:
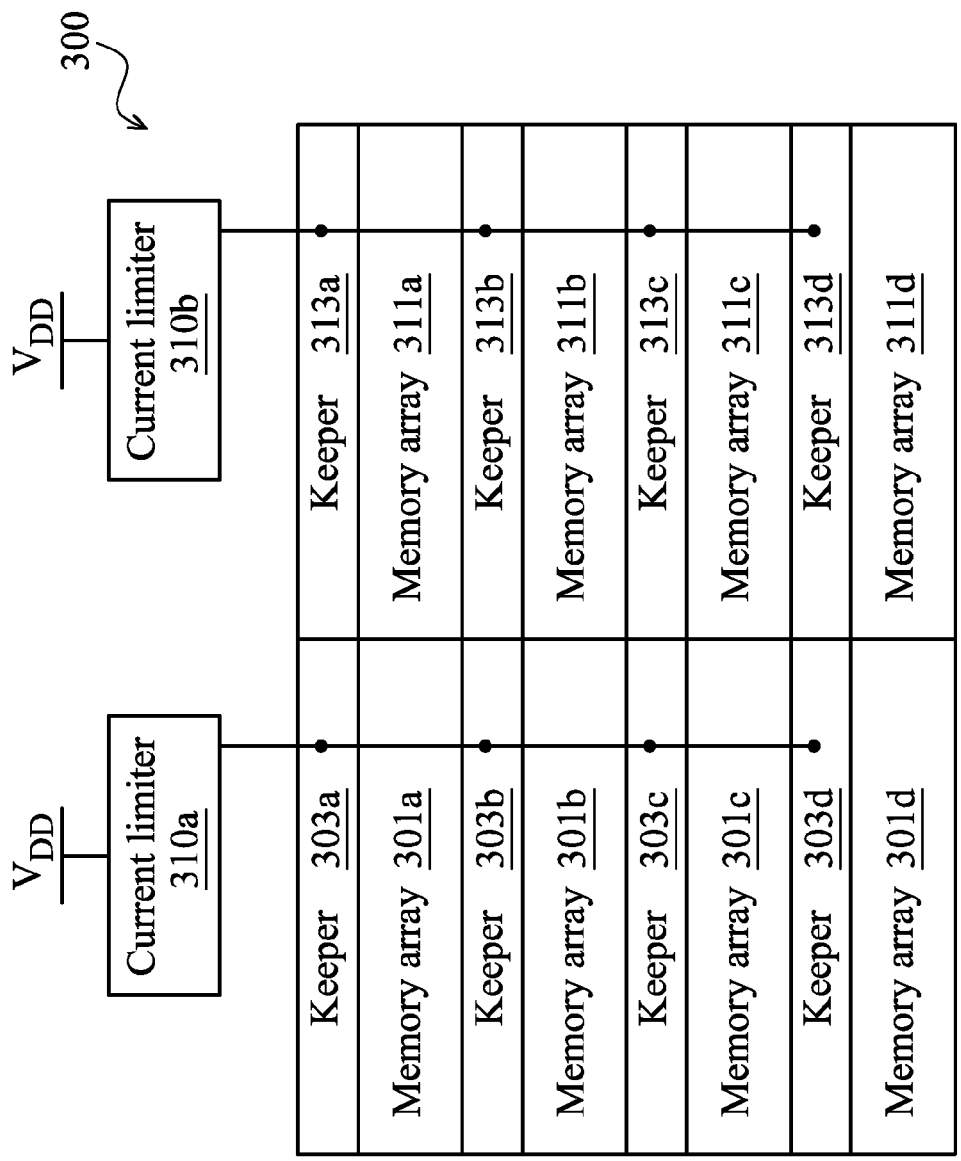
FIG. 7 is a schematic drawing showing another memory circuit having two current limiters for two corresponding columns of keepers.

FIG. 7 is a schematic drawing showing another memory circuit having two current limiters for two corresponding columns of keepers. Items of a memory circuit 300 in FIG. 7 that are the same or similar items of the integrated circuit 100 in FIG. 1 are indicated by the same reference numerals, increased by 200 or 210. In FIG. 7, the memory circuit 300 can include a plurality of memory arrays, e.g., memory arrays 301a-301d and 311a-311d, and a plurality of keepers, e.g., keepers 303a-303d and 313a-313d. Each of the memory arrays 311a-311d is disposed adjacent a corresponding one of the memory arrays 301a-301d, respectively.

The keepers 303a-303d and 313a-313d can each be electrically coupled with the corresponding memory arrays 301a-301d and 311a-311d, respectively. Current limiters 310a and 310b can be electrically coupled with and shared by the keepers 303a-303d and 313a-313d, respectively. In some embodiments, the current limiters 310a and 310b can each be electrically coupled with and shared by two or more columns of keepers.

Figure 8:
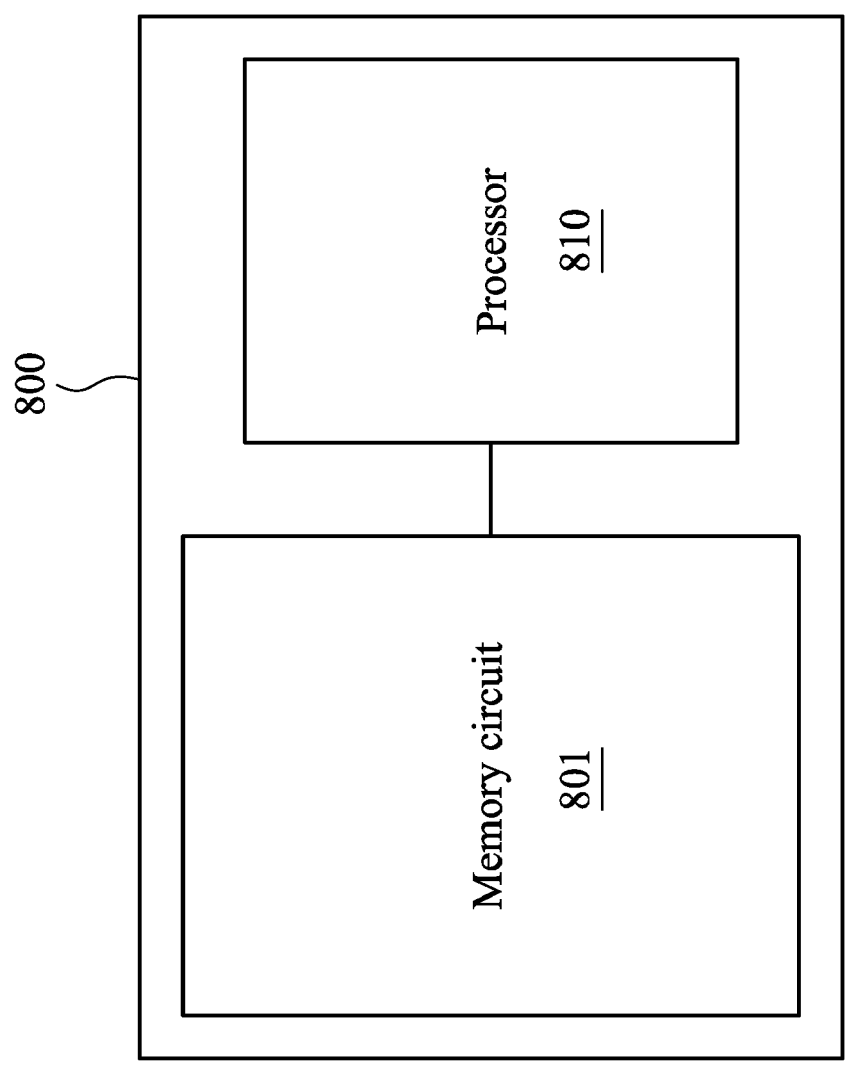
FIG. 8 is a schematic drawing showing a system including an exemplary memory circuit.

FIG. 8 is a schematic drawing showing a system including an exemplary memory circuit. In FIG. 8, a system 800 can include a processor 810 coupled with a memory circuit 801. The memory circuit 801 can be similar to one of the memory circuits 100-300 described above in conjunction with FIGS. 1-7, respectively. The processor 810 can be a processing unit, central processing unit, digital signal processor, or other processor that is suitable for accessing data of memory circuit.

In some embodiments, the processor 810 and the memory circuit 801 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system 800 including the memory circuit 801 can provide an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
a first plurality of memory arrays disposed in a column fashion;
a first plurality of keepers, each of which is electrically coupled with a corresponding one of the first plurality of memory arrays; and
a first current limiter electrically coupled with and shared by the first plurality of keepers.

2. The memory circuit of claim 1, wherein the first plurality of memory arrays each includes at least one memory cell including a read port, the read port is configured to allow a first current flowing through the read port if the read port is turned on and a voltage drop across the read port during a sensing period, the first current limiter is configured to control a second current flowing through the first current limiter during the sensing period, and the first current is larger than the second current during the sensing period.

3. The memory circuit of claim 1, wherein the first current limiter comprises a first transistor and the first transistor is turned on during at least one of a sensing period and a pre-charge period.

4. The memory circuit of claim 3, wherein the first plurality of keepers each comprises:
at least one second transistor; and
a logic gate, wherein an output end of the logic gate is electrically coupled with a gate of the at least one second transistor, and at least one input end of the logic gate is electrically coupled with at least one drain of the at least one second transistor.

5. The memory circuit of claim 4, wherein the at least one second transistor each is a core transistor, and a channel length of the first transistor is larger than a channel length of the at least one second transistor.

6. The memory circuit of claim 4, wherein the logic gate is a NOT gate and the at least one second transistor includes a single transistor.

7. The memory circuit of claim 4, wherein the logic gate is an NAND gate and the at least one second transistor includes two or more transistors.

8. The memory circuit of claim 1, further comprising:
a second plurality of memory arrays disposed in a column fashion; and
a second plurality of keepers each of which is electrically coupled with a corresponding one of the second plurality of memory arrays, wherein the second plurality of keepers are electrically coupled with the first current limiter.

9. The memory circuit of claim 1, further comprising:
a third plurality of memory arrays disposed in a column fashion, wherein each of the third plurality of memory arrays is disposed adjacent a corresponding one of the first plurality of memory arrays;
a third plurality of keepers each of which is electrically coupled with a corresponding one of the third plurality of memory arrays; and
a second current limiter electrically coupled with the third plurality of keepers.

10. A memory circuit comprising:
a first current limiter, wherein the first current limiter comprises a first transistor;
a first plurality of memory arrays disposed in a column fashion; and
a first plurality of keepers each of which is electrically coupled with a corresponding one of the first plurality of memory arrays, the first plurality of keepers being electrically coupled with the first current limiter, wherein the at least one first plurality of keepers each comprises:
at least one second transistor; and
a logic gate, wherein an output end of the logic gate is electrically coupled with a gate of the at least one second transistor, and at least one input end of the logic gate is electrically coupled with at least one drain of the at least one second transistor.

11. The memory circuit of claim 10, wherein the first plurality of memory arrays each includes at least one memory cell including a read port, the read port is configured to allow a first current flowing through the read port if the read port is turned on and a voltage drop across the read port during a sensing period, the first current limiter is configured to control a second current flowing through the first current limiter during the sensing period, and the first current is larger than the second current during the sensing period.

12. The memory circuit of claim 10, wherein the first transistor is turned on during at least one of a sensing period and a precharge period.

13. The memory circuit of claim 10, wherein the at least one second transistor each is a core transistor, and a channel length of the first transistor is larger than a channel length of the at least one second transistor.

14. The memory circuit of claim 10, further comprising
a second plurality of memory arrays disposed in a column fashion; and
a second plurality of keepers each of which is electrically coupled with a corresponding one of the second plurality of memory arrays, wherein the second plurality of keepers are electrically coupled with the first current limiter.

15. The memory circuit of claim 10, further comprising
a third plurality of memory arrays disposed in a column fashion, wherein each of the third plurality of memory arrays is disposed adjacent a corresponding one of the first plurality of memory arrays;
a third plurality of keepers each of which is electrically coupled with a corresponding one of the third plurality of memory arrays; and
a second current limiter coupled with the third plurality of keepers.

16. A memory circuit comprising:
a first current limiter configured to control a first current flowing through the first current limiter during a sensing period, wherein the first current limiter comprises a first transistor;
a first plurality of memory arrays disposed in a column fashion, wherein the first plurality of memory arrays each includes at least one memory cell including a read port, and the read port is configured to allow a first current flowing through the read port if the read port is turned on and a voltage drop across the read port during the sensing period;
a first plurality of keepers each of which is electrically coupled with a corresponding one of the first plurality of memory arrays, wherein the at least one first plurality of keepers each comprises:
at least one second transistor, wherein at least one source end of the at least one second transistor is electrically coupled with the first current limiter; and
a logic gate, wherein an output end of the logic gate is electrically coupled with a gate of the at least one second transistor, and at least one input end of the logic gate is electrically coupled with at least one drain of the at least one second transistor.

17. The memory circuit of claim 16, wherein the first transistor is turned on during at least one of a sensing period and a precharge period.

18. The memory circuit of claim 16, wherein the at least one second transistor each is a core transistor, and a channel length of the first transistor is larger than a channel length of the at least one second transistor.

19. The memory circuit of claim 16, wherein the logic gate is a NOT gate and the at least one second transistor includes a single transistor.

20. The memory circuit of claim 16, wherein the logic gate is an NAND gate and the at least one second transistor includes two or more transistors.

* * * * *